United States Patent [19]

Watanabe

[11] Patent Number: 5,455,744
[45] Date of Patent: Oct. 3, 1995

[54] ELECTRONIC CONTROL APPARATUS WITH EASILY MOUNTED DEVICE UNITS

[75] Inventor: Yuichi Watanabe, Tokyo, Japan

[73] Assignee: Kay Electronics Industries Co., Ltd., Tokyo, Japan

[21] Appl. No.: 111,950

[22] Filed: Aug. 26, 1993

[30] Foreign Application Priority Data

May 27, 1993 [JP] Japan ................................. 5-126152

[51] Int. Cl.⁶ .................................................. H05K 7/14
[52] U.S. Cl. ......................... 361/801; 361/729; 361/732; 361/759; 361/823; 174/250; 439/60; 439/108
[58] Field of Search .................................. 361/729, 732, 361/752, 759, 796, 801, 802, 823; 174/250; 439/60–62, 108, 109

[56] References Cited

U.S. PATENT DOCUMENTS 4,533,793  8/1985  Geppert .................................. 179/99 R

*Primary Examiner*—Leo P. Picard
*Assistant Examiner*—Y. Whang
*Attorney, Agent, or Firm*—Sughrue, Mion, Zinn, Macpeak & Seas

[57] ABSTRACT

An electronic control apparatus in which each device unit is detachably mounted on an open front portion of a box-shaped main body by a press-and-clamp engaging mechanism. A nail plate is formed on both side faces of a terminal block. By engaging the nail plates with engaging holes formed in a unit main body, the terminal block can be attached to the unit main body and connected to a unit circuit board at the same time. A triangular color segment is attached to an indicator portion of each device unit for identification of its type. A palm-top type program setting unit is connected to a processing unit through lead wires. The inside circuitry of the setting unit is exposed by sliding its operation section.

6 Claims, 10 Drawing Sheets

ELECTRONIC CONTROL APPARATUS WITH EASILY MOUNTED DEVICE UNITS

BACKGROUND OF THE INVENTION

The present invention relates to electronic control apparatuses. More specifically, the invention relates to an electronic control apparatus, such as a programmable controller, which contains device units including a power supply unit, a processing unit, input and output units, etc.

FIG. 17 is a perspective view showing the components of a conventional electronic control apparatus, i.e., a programmable controller (hereinafter referred to as "PC").

In FIG. 17, reference character A represents a box-shaped casing made of synthetic resin and having an open front; B, a power supply unit inserted into the casing A; and C, a processing unit adjacent to and narrower than the power supply unit B and including a CPU. The power supply unit B and the processing unit C are fixed to the casing A by screwing their front panels to the casing A. Reference character D represents a connecting portion provided in the processing unit C; E, a sequence program setting unit (hereinafter abbreviated as "setting unit"); and F, a connector from a printed circuit board in the setting unit E.

The setting unit E is attached to the front of the power supply unit B and the processing unit C by inserting its connector F into the connecting portion D. Front panels of two pairs of input units G and output units H are also screwed to the casing A at the side of the processing unit C. A terminal block I, to which a control object is to be connected, and a signal indicator portion J are provided on each of the input units G and the output units H. A printed circuit board K is attached to the back of each front panel, and is connected to a mother board (not shown) provided on the bottom of the casing A.

In the PC of the above construction, a control program preset by the setting unit E is stored in the processing unit C. An input signal from the control object is provided to the input unit G, subjected to processing by the processing unit C, and a control signal produced based on the processing results is output from the output unit H. As a result, the control object is sequence-controlled in accordance with the preset program.

In the conventional control electronic apparatus described above, the front panel of each device unit is fixed to the casing A by two or more screws. The apparatus is therefore cumbersome and requires numerous steps to initially assemble the apparatus and to disassemble and reassemble it at the time of maintenance or inspection. In addition, a large number of parts are needed. Further, where screws are directly engaged with the synthetic resin casing, the casing threads may be destroyed thus preventing proper assembly. Although this problem can be solved if molding is performed in order to employ nuts and bolts, this type of molding causes an additional molding cost.

Since the terminal blocks I are exposed from the front panels of the input units G and the output units H, there may occur not only accidental contact or short-circuiting but also a contact failure caused by the adherence of dirt, dust, etc. Also, since the input units G and the output units H have almost the same outward appearance, it is difficult to discriminate between the two, possibly leading to improper mounting/connection and/or faulty operation of those units, resulting in a fault of the apparatus. To prevent erroneous mounting/connection of the input and output units G and H, it has been proposed to indicate the type of each unit by characters, symbols, etc. provided on the front panel, or to form the front panels using resins of different colors for the respective types of front panels. However, these measures increase the number of steps and, therefore, the cost of the molding process. The setting unit E is attached to the front of the power supply unit B and the processing unit C by inserting the connector F into the connecting portion D. Variations in the height of the setting unit E after it is fixed to the apparatus may cause inconvenience in its handling, the existence of a step formed by the setting unit E and the front panels of the input and output units G and H is evidence of a poor design. The relative distance between the keys and the operator varies with the position of the operator, and it may therefore be the case that information on a display is misread due to light reflection at a certain viewing angle. If a program is erroneously set due to misreading of displayed information, a sequence control operation becomes abnormal, causing various problems. The control process may therefore have to be suspended to check the program.

SUMMARY OF THE INVENTION

The present invention has been made in view of the above noted problems in the conventional apparatus, and has an object of abolishing substantially entirely the use of screws to fix respective device units to a casing.

Another object of the invention is to realize an electronic control apparatus which can be assembled, maintained and inspected easily in a short period.

Another object of the invention is to enable easy identification of the type of each device unit by adding a small indication segment to it.

Still another object of the invention is to realize an electronic control apparatus which can be easily programmed by using a hand-held setting unit.

A further object of the invention is to realize an electronic control apparatus superior in design by employing device units having similar shapes and sizes.

According to the invention, an electronic control apparatus includes:

a generally box-shaped main body open to front side and having a front circumferential portion;

a mother board provided in the main body;

a plurality of device units connected to the mother board; and a press-and-clamp type engaging mechanism for detachably engaging each of the plurality of device units with the front circumferential portion.

According to another aspect of the invention, an electronic control apparatus includes:

a generally box-shaped main body open to a front side and having a front circumferential portion;

a mother board provided in the main body;

a plurality of device units connected to the mother board;

a plurality of unit circuit boards;

a mechanism for detachably mounting each of the unit circuit boards to a corresponding one of the device units;

a plurality of terminal blocks;

a mechanism for detachably connecting each of the unit circuit boards to a corresponding one of the terminal blocks; and a hooking portion provided on at least one side face of the terminal block, for releasable engagement with an engaging hole formed in the device unit, wherein the unit circuit board is brought into engagement with the terminal block when the hooking portion is engaged with the engaging hole.

According to still another aspect of the invention, electronic control apparatus includes:

a generally box-shaped main body open to a front side and having a front circumferential portion;

a mother board provided in the main body;

a plurality of device units connected to the mother board; and a plurality of color segments replaceably attached to the respective device units and having colors indicative of the type of the device unit to which the segment is attached.

According to an further aspect of the invention, a electronic control apparatus includes:

a generally box-shaped main body open to a front side and having a front circumferential portion;

a mother board provided in the main body;

a plurality of device units connected to the mother board; and a palm-top type setting unit electrically connected to at least one of the plurality of device units and having a display section and a slidable operation section, for setting a control operation of the control electronic apparatus, wherein an inside circuit of the setting unit is exposed when the operation section is slid.

DESCRIPTION OF THE PREFERRED EMBODIMENTS

Figure 1:
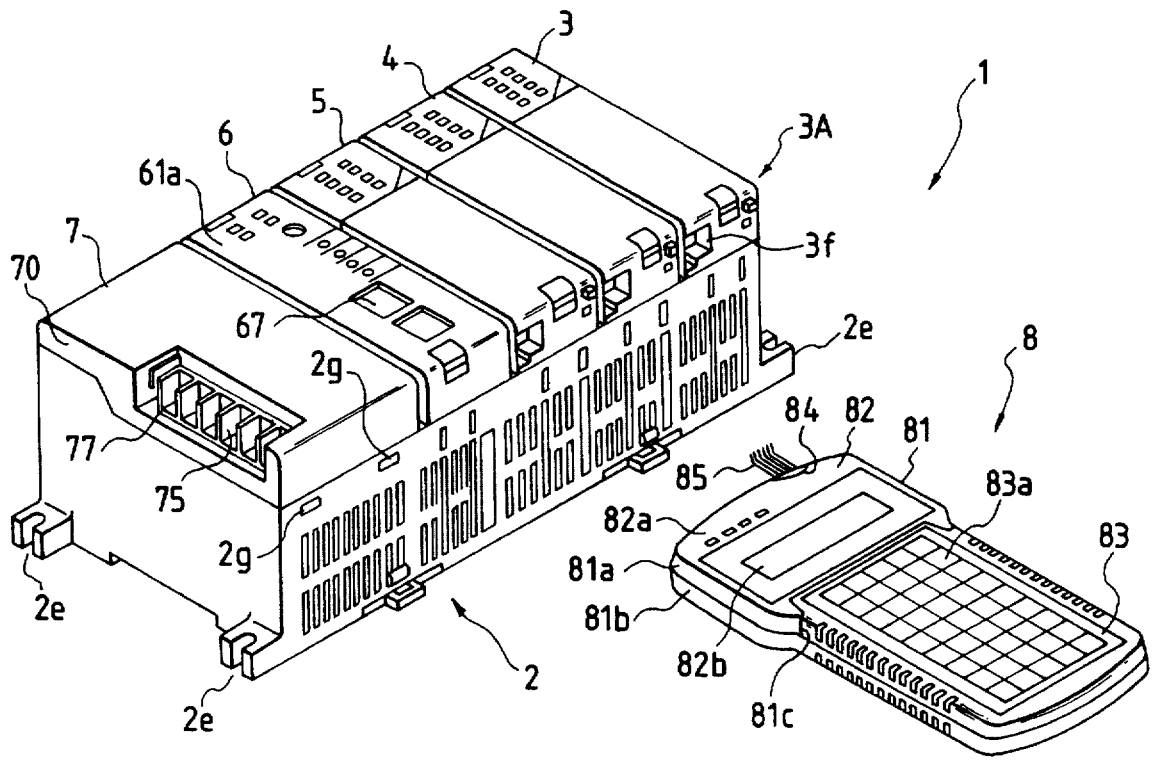
FIG. 1 is a perspective view of an electronic control apparatus according to an embodiment of the present invention.
Figure 2:
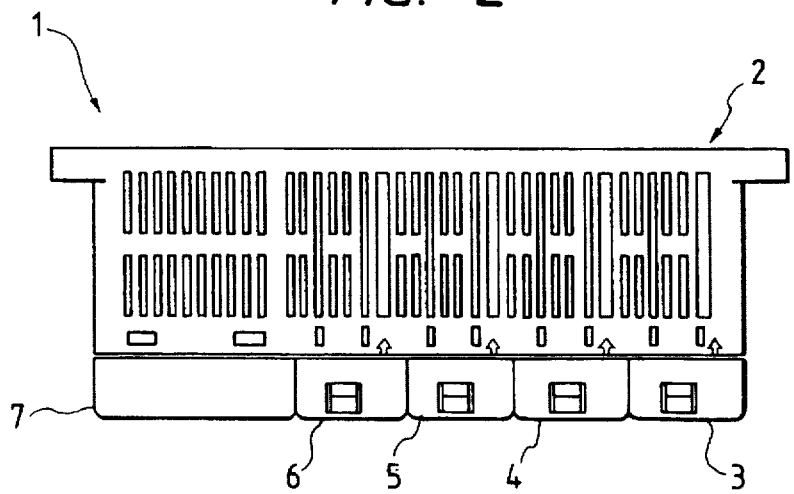
FIG. 2 is a top view of the electronic control apparatus of FIG. 1.

FIG. 1 is a perspective view of a control electronic apparatus, i.e., a PC according to an embodiment of the present invention, and FIG. 2 is a top view thereof.

In FIGS. 1 and 2, a casing of a control electronic apparatus 1 is formed by molding a synthetic resin. Reference numeral 2 represents a main body, and numerals 3–7 represent respective device units. For example, the device units include an output unit 3, input units 4 and 5, a processing unit 6 and a power supply unit 7. The respective device units 3–7 (device units 3–6 have similar outlines) are attached to the front of the main body 2.

Figure 3:
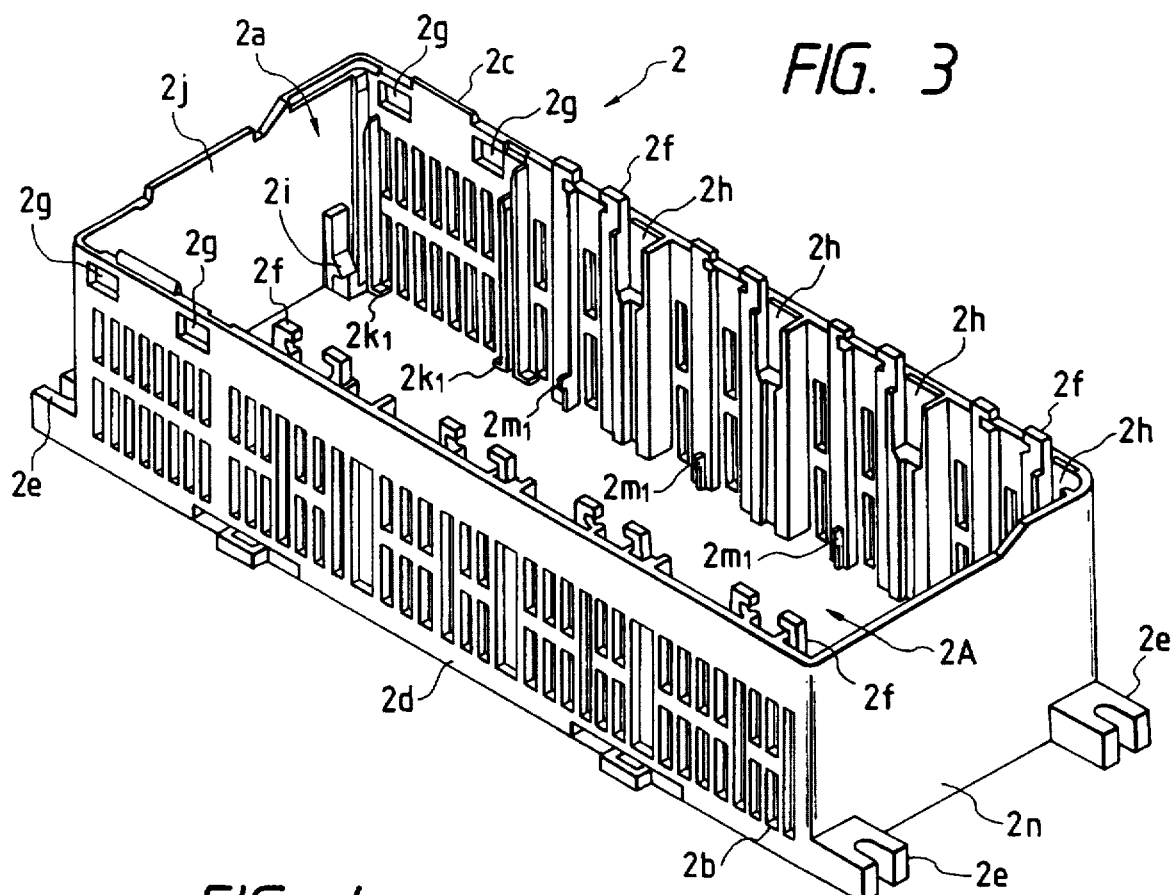
FIG. 3 is a perspective view of a main body of the electronic control apparatus.
Figure 4:
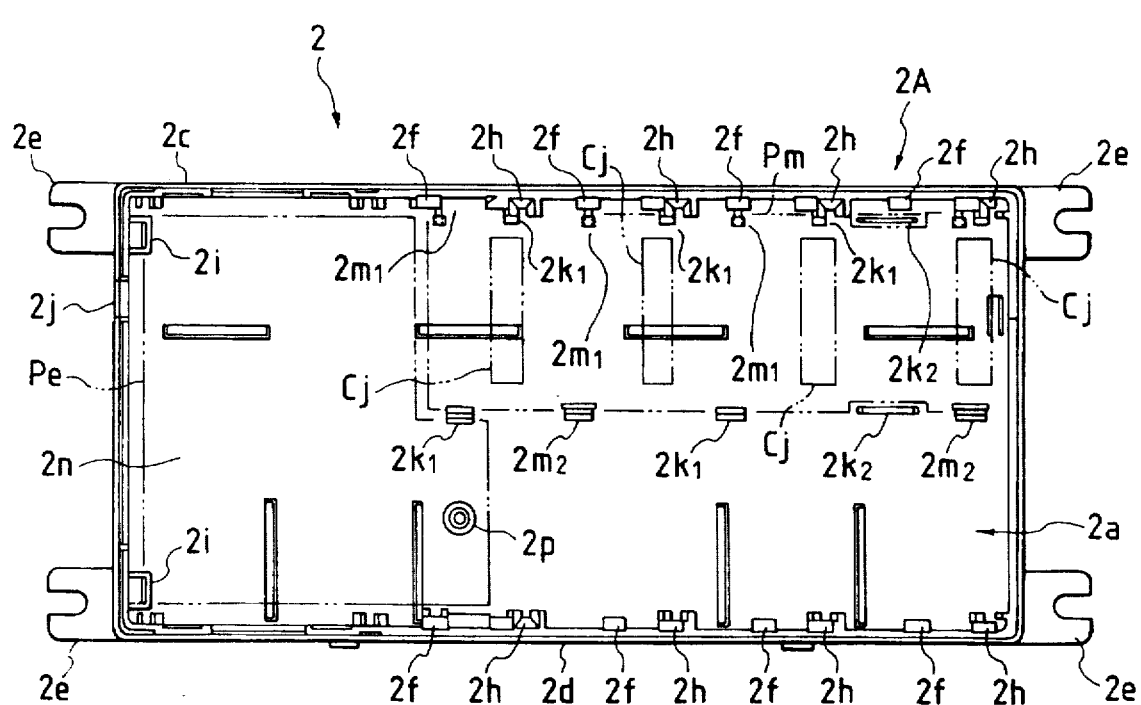
FIG. 4 is a top view showing the inside of the main body.
Figure 5:
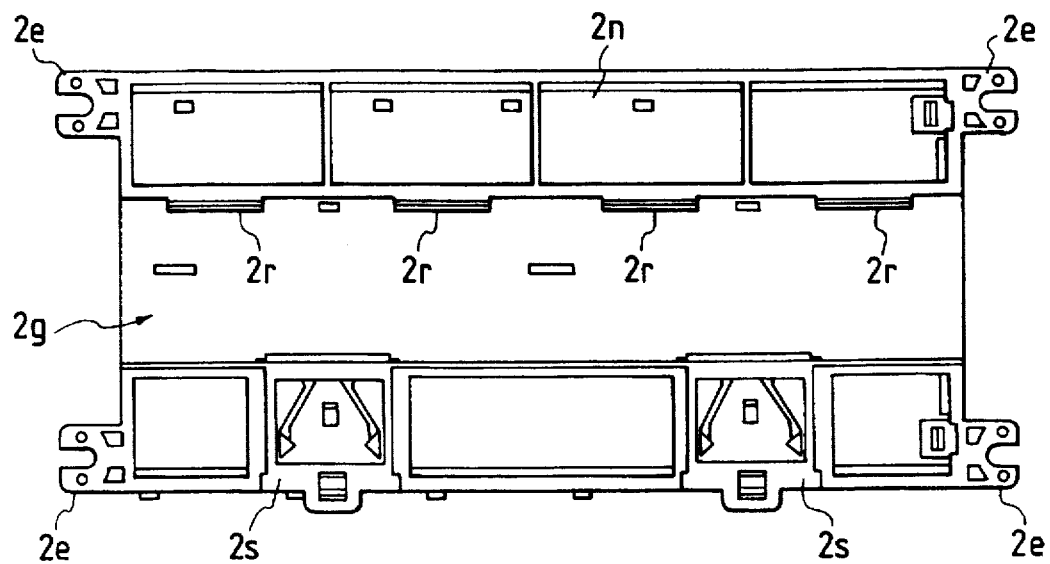
FIG. 5 is a bottom view of the main body.
Figure 6:
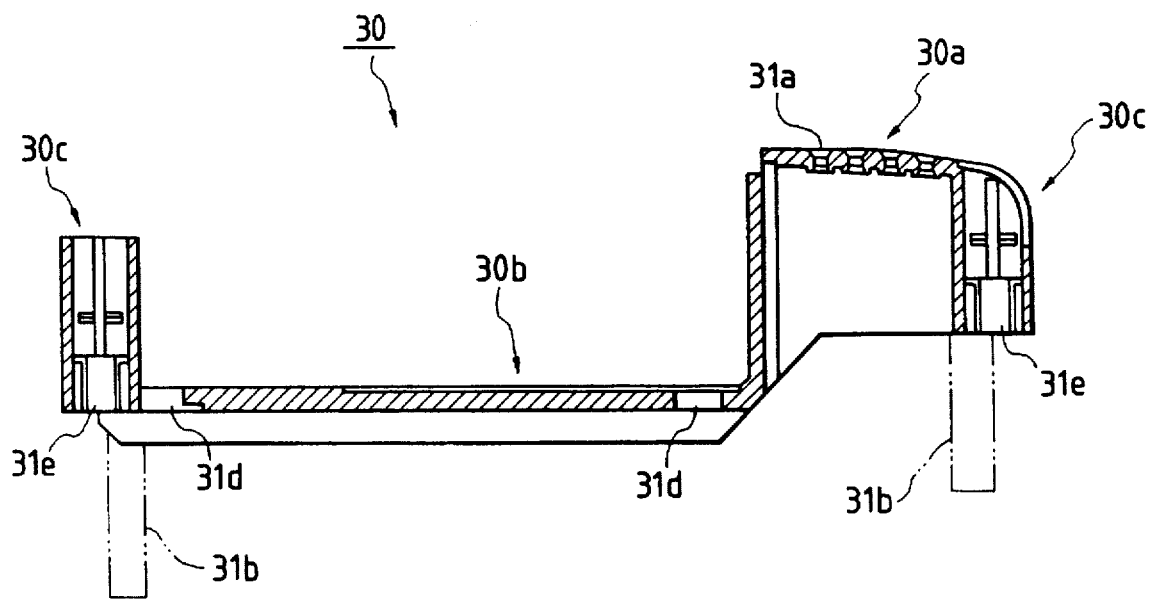
FIG. 6 is a sectional view of an output unit.

FIGS. 3–5 show details of the structure of the main body 2. The main body 2 is formed into a right-angled box having an opening 2a at the front. As indicated by chain double-dashed lines in FIG. 4, a power supply board Pe and a mother board Pm are incorporated in the main body 2. Connector jacks Cj, to which the output unit 3 etc. are to be connected, are mounted on the mother board Pm together with other electronic components.

A large number of ventilation grooves 2b are penetrated through a top wall 2c and a bottom wall 2d, and fixing legs 2e are provided at the four corners. Eight engaging nails 2f each having a pair of nails are protruded from the opening 2a, and engaging windows 2g are provided close to the opening face. The engaging nails 2f have bent tip portions to assume a gate-like shape, and are provided on the top wall 2c and the bottom wall 2d so as to form four pairs. The eight engaging nails 2f are used in attaching the four device units 3–6 (output unit 3 etc.) to the main body 2, and the engaging windows are used in attaching the power supply unit 7 to the main body 2. Shaped to provide high detachability, the engaging nails 2f serve to attach the output unit 3 etc. to the main body 2 in an easily detachable manner. Shaped to provide hard-to-detach engagement, the engaging windows 2g serve to fixedly attach the power supply unit 7 to the main body 2.

A plurality of insertion grooves 2h are formed on the inner surfaces of the top and bottom walls 2c and 2d in the depth direction so as to be opposed to each other. Two large resilient engaging nails 2i are provided on the inner surface of a left wall 2j. Stands 2k1 and 2k2 and small engaging nails 2m1 and 2m2 are formed on the inner surfaces of the top wall 2c and a back wall 2n. Each of a plurality of insertion grooves 2h has a wider entrance portion so as to smoothly guide the corresponding unit circuit board (described later) when it is inserted.

The stands 2k1 and 2k2 serve for placement and positioning, respectively. The engaging nails 2m1 and 2m2 are fixed and movable, respectively. The engaging nails 2i, stands 2k1 and 2k2 and engaging nails 2m1 and 2m2 constitute an engaging mechanism 2A for fixing, without using any screws, the power supply board Pe and the mother board Pm so that they are elevated from the back wall 2n. A screw mount 2p serves, when necessary, for fixing of the power supply board Pe (see FIG. 4).

Referring to FIG. 5, a fixing portion 2g in the form of a band-like recess and extending horizontally is formed on the back of the back wall 2n. L-shaped protrusions 2r are provided on one side of the fixing portion 2g, and a pair of (right and left) movable plates 2s are formed on the back wall 2n. The movable plates 2s are slid vertically in parallel with the back wall 2n to advance or retract their nipping portions (upper portions) with respect to the fixing portion 2g. The control electronic apparatus 1 is detachably mounted on a DIN rail of a distribution panel etc. located at a process site by means of the fixing portion 2g.

Among the device units 3–7 to be attached to the main body 2, the four device units 3–6 (excluding the leftmost wider power supply unit 7) have the same width. Since the left-side three units 4–7, i.e., the output unit 3 and input units 4 and 5 have a mechanically identical structure, the structure of the output unit 3 is described below with reference to FIGS. 6–9.

Figure 7:
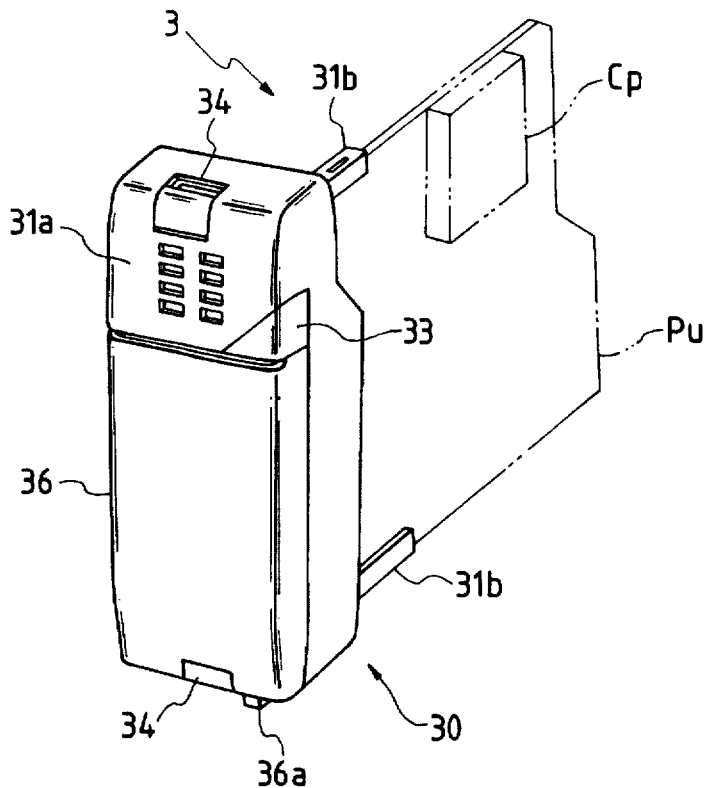
FIG. 7 is a perspective view of the output unit.
Figure 8:
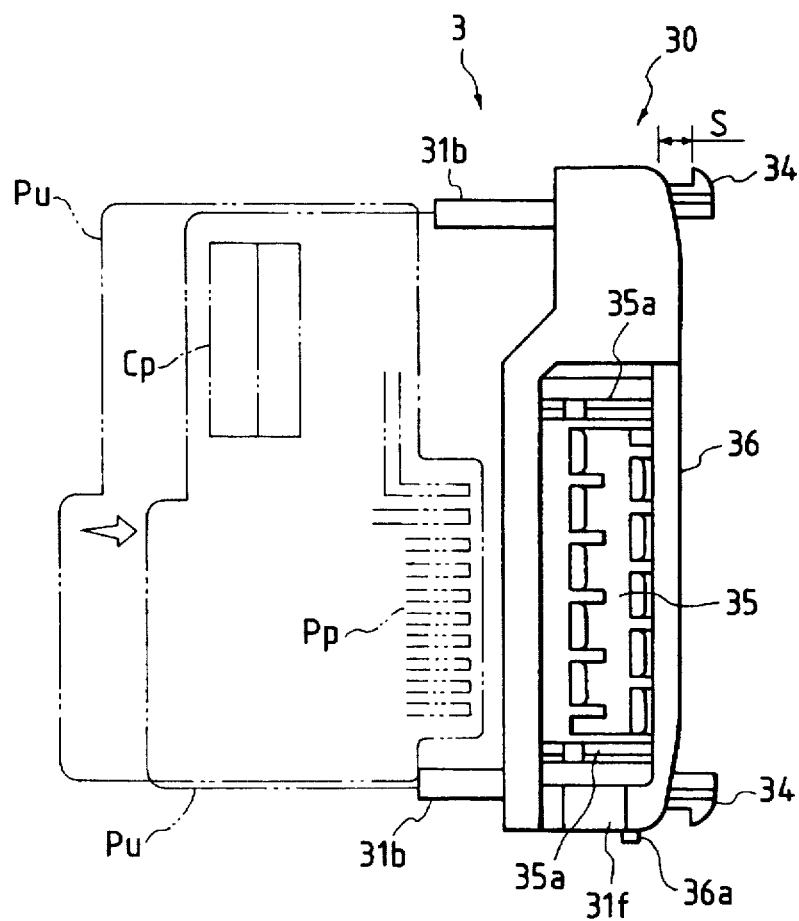
FIG. 8 is a side view of the output unit.
Figure 9:
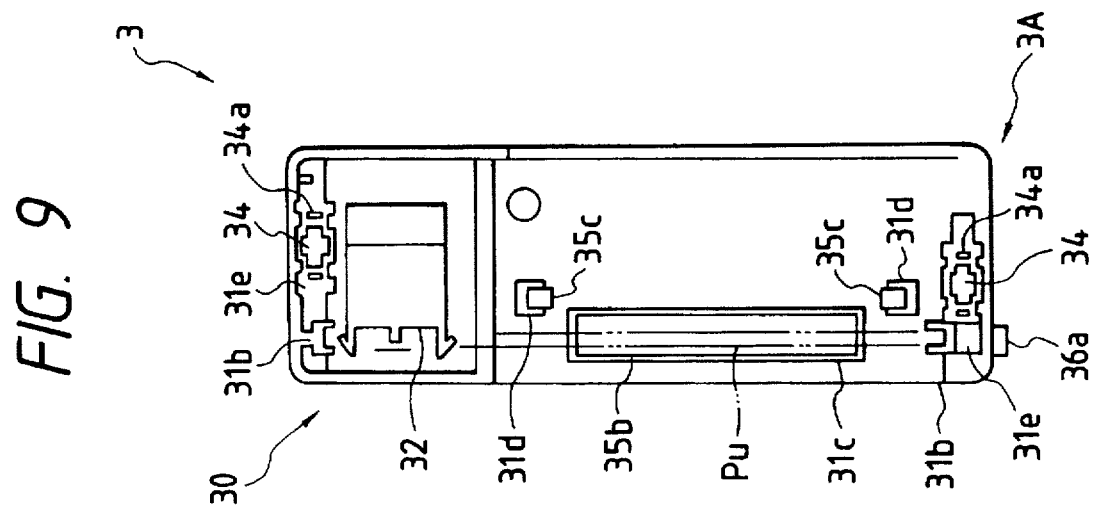
FIG. 9 is a back view of the output unit.

In FIGS. 6–9, reference numeral 30 represents a unit main body of the output unit 3. As shown in sectional view of FIG. 6, the unit main body 30 has a generally truck-like shape and consists of a bonnet-like indicator portion 30a, a loading portion 30b adjacent to the indicator portion 30a, and mounting portions 30c located at the two ends. In FIGS. 7–9, Pu and Cp represent a unit circuit board and a connector plug, respectively. The indicator portion 30a of the unit main body 30 have 4-row-by-2-column rectangular indication windows 31a for output circuits of numbers 0–7. Two guide poles 31b having bracket-shaped cross-sections extend from the respective mounting portions 30c so that grooves are opposed to each other.

A socket hole 31c is penetrated through the loading portion 30b, and two nail holes 31d are opened above and below the socket hole 31c with small distances from it. While nipping the unit circuit board Pu from the both sides by their bracket structures, the two guide poles 31b guide the output unit 3 in its mounting direction toward the main body 2. Engaging holes 31e are formed in the respective mounting portions 30c located at the two ends. Reference symbol 31f represents a space through which output lead wires are introduced, and symbols 31g and 31h represent a hooking hole and an exposing hole, respectively (also see FIGS. 12(a), 12(b) and 13).

An indicator 32 is disposed at the back side of the indication windows 31a of the indicator portion 30a. For example, in the indicator 32, light beams emitted from LEDs mounted on the unit circuit board Pu are input to the respective indication windows 31a. A triangular color segment 33 is inserted into the indicator portion 30a at its corner. Plungers 34 are incorporated in the respective engaging holes 31e formed in the mounting portions 30c so as to be movable vertically. Latches 34a are made of nylon etc. The color segment 33 is attached to the indicator portion 30a in a replaceable manner, and serves to discriminate, by its color, among the three device units 3–5 of different types having the same structure.

Figure 12A:
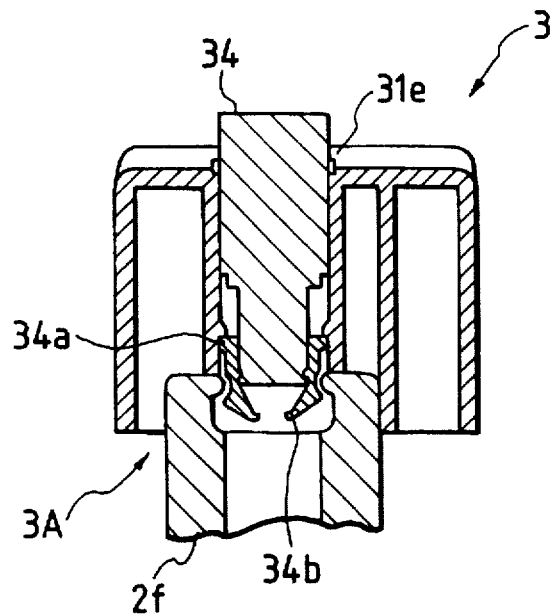
FIGS. 12(a) and 12(b) are sectional views illustrating action of an engaging mechanism.
Figure 12B:
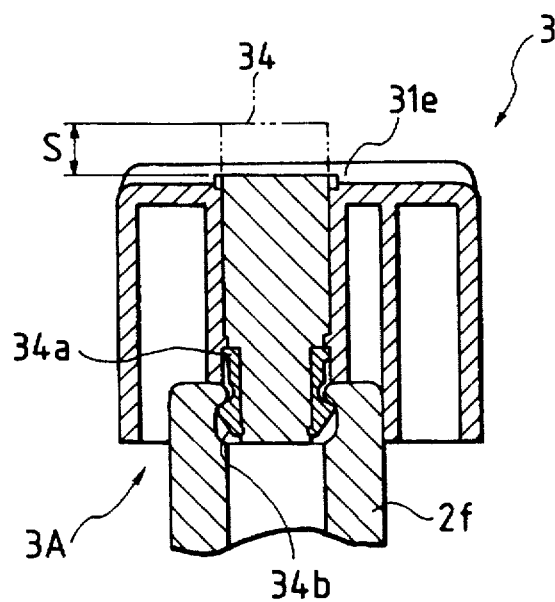

As is also shown in FIGS. 12(a) and 12(b), a square frame portion of the latch 34a is pressure-inserted into the attachment-face-side portion of the engaging hole 34e, and two resilient clip portions 34b having thin tips are opposed to the side faces of the plunger 34. The clip portions 34b are formed so as to be inserted into the engaging nail 2f having paired nails when the output unit 3 is attached to the main body 2. When the plunger 34 is raised to the upper limit of a stroke s, its lower portion escapes from the clip portions 34b, so that the clip portions 34b are freed to approach each other. When the plunger 34 is pushed down, its lower portion goes into the clip portions 34b and is held by the expanded clip portions 34b. An engaging mechanism 3A for detachably engaging the device unit (e.g., output unit 3) with the main body 2 includes the latch 34a, plunger 34, engaging nail 2f and other members.

Reference numeral 35 represents a terminal block, and numeral 35b represents a socket of the terminal block 35. A patterned plug Pp, where conductive pattern lines of the unit circuit board Pu are gathered, is inserted into the socket 35b (as indicated by an arrow in FIG. 8). The terminal block 35 is closed by a cover 36. A knob 36a having an elastic nail 36b and a protrusion 36c are formed on the cover 36. Nail plates 35a, which elastically deform with intermediate connecting portions to the terminal block 35 serving as supporting points, are unified with the respective side faces of terminal block 35 by molding. Symbols 35c and 35d represent a nail of the nail plate 35a and a top knob, respectively. The protrusion 36c at the tip of the cover 36 is inserted into the hooking hole 31g of the unit main body 30, and the nail 36b at the bottom side of the cover 36 engages with the exposing hole 31h.

Figure 10:
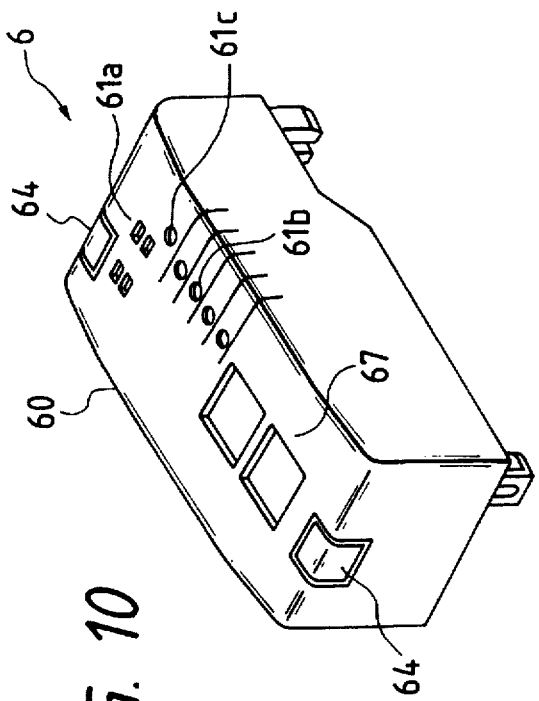
FIG. 10 is a perspective view of a processing unit.

As shown in FIG. 10, 2-row-by-2-column indication windows 61a, circular indication windows 61b and an elliptical switch window 61c to accommodate a switch for controlling RUN/STOP of the processing unit 6 are provided in an indicator portion of the processing unit 6. Although not specifically shown in FIG. 10, in the same manner as in the output unit 3, an indicator that provides light indication through the circular indication windows 61b, for instance, during the operation of a sequencer, and other elements are incorporated on the back side of the unit main body 60. Square connecting holes 67, into which connectors of lead wires for leading setting inputs are to be inserted, are formed in the processing unit 6.

Figure 11:
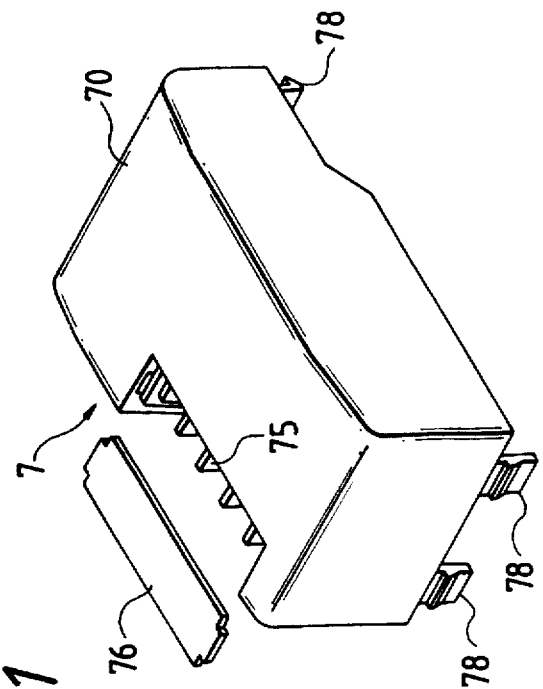
FIG. 11 is a perspective view of a power supply unit.

Referring to FIG. 11 showing the power supply unit 7, reference numeral 70 represents a unit main body of the power supply unit 7; 75, a terminal block; 76, a transparent cover provided over the terminal block 75; and 78, engaging nails. The engaging nails 78 engage with the engaging windows 2g of the main body 2. Lead wires for the AC 100 V power line, grounding and other purposes are connected to screw terminals of the terminal block 75. The voltage of AC 100 V input to the power supply unit 7 is lowered to 12 or 24 V, which is then supplied, via the mother board Pm, to the device units such as the processing unit 6 as a power supply voltage to, for instance, drive those.

Returning to FIG. 1, in a setting unit 8, reference numeral 81 represents a two-part case of the setting unit 8 consisting of an upper case 81a and a lower case 81b; 82, a display; and 83, an operation section. The display 82 includes display windows 82a and 82b for LEDs and a liquid crystal display, respectively. The operation section 83 is constituted of a large number of touch keys arranged in a matrix for writing to a program memory. The operation section 83, i.e., the lower half of the upper case 81a can be slid horizontally with a line 81c as the boundary so that the inside of the setting 8 is exposed. One of the two connectors provided at the two ends of the lead wires 85 is fitted into a connecting hole 84, and the other connector of the lead wires 85 is fitted into a connecting hole 67 of the processing unit 6. Thus, the setting unit 8 is connected to the processing unit 6. Reference numerals 86 and 87 represent a setting circuit board and the liquid crystal display (see FIGS. 14 and 15).

An assembling operation of the PC having the above described constitution is described below.

First, the mother board Pm on which the electronic components and four connector jacks Cj have been mounted is inclined and its top portion is inserted between the fixed engaging nails 2m1 and the stands 2k1 on the side of the top wall 2c of the main body 2. Then, the mother board Pm is pressed against the main body 2, so that the mother board Pm is flattened, i.e., its bottom portion is settled on the stands 2k1 for placement and the mother board Pm is locked by the movable nails 2m2. The mother board Pm is positioned in the horizontal plane as a result of fitting of its peripheral recesses into the stands 2k2.

In the similar manner, the power supply board Pc is fixed by means of the large engaging nails 2i, the stand 2k1, etc. and accommodated in the inside of the main body 2 so as to be in parallel with the back wall 2n. Thus, the mother board Pm and the power supply board Pe are accommodated as indicated by the chain double-dashed lines in FIG. 4. The mother board Pm can be removed from the main body 2 by applying lateral weak force to the tips of the engaging nails 2m2 to open those, i.e., release their engagement with the mother board Pm. If the engaging nail 2m2 is adapted to have two nails at different levels and the stands 2k1 and 2k2 are constructed to have steps, the space on the side of the bottom wall 2d can be utilized for, for instance, a mother board of an extension unit.

Figure 13:
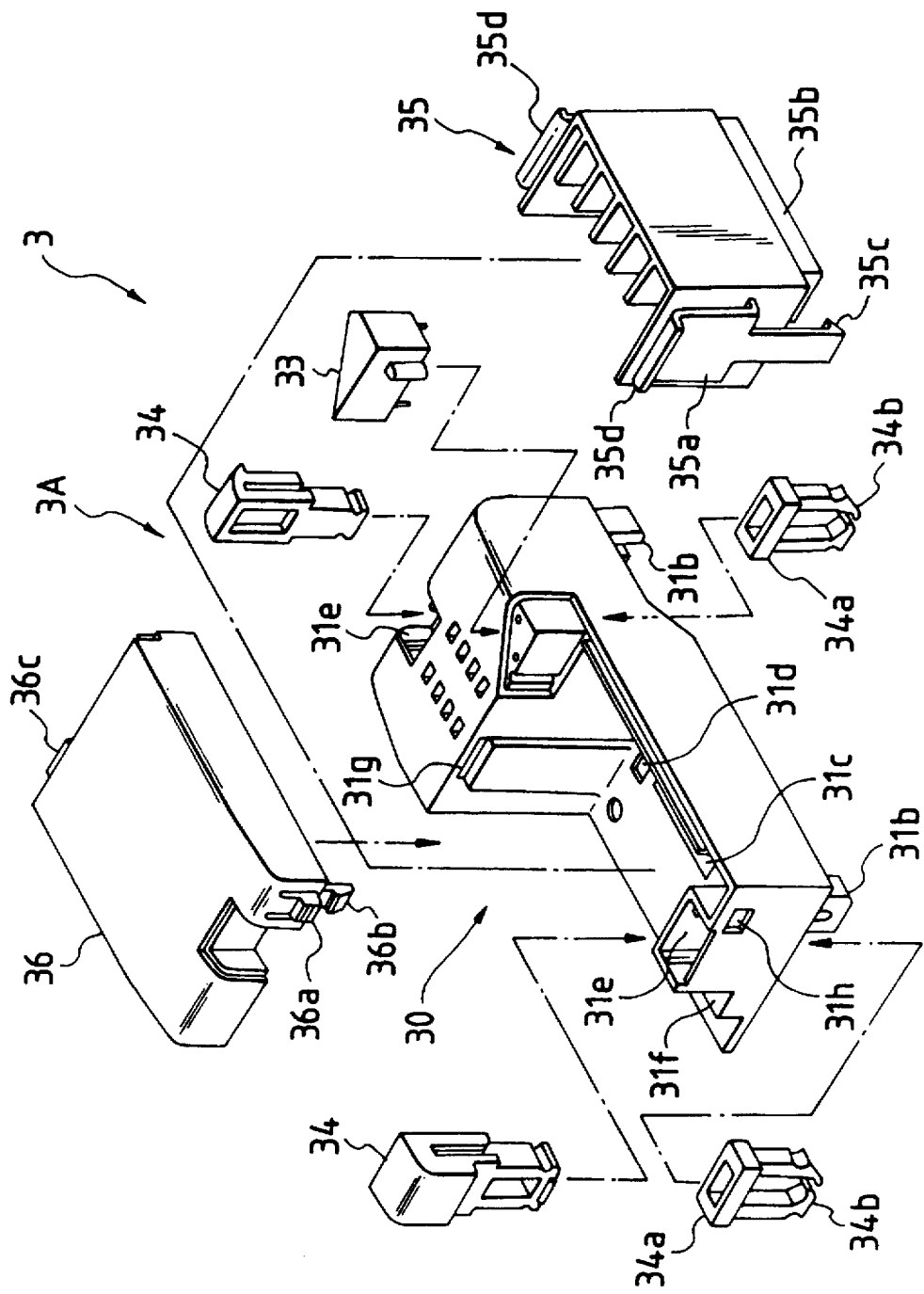
FIG. 13 is a broken perspective view showing how the output unit is assembled.

Then, as shown in FIG. 13, the latch 34a is pressure-inserted into the engaging hole 31e, from below it, of each of the mounting portions 30c on both sides of the output unit 3, and the plunger 34 is inserted into the engaging hole 31e from above it, so that the latch 34a and the plunger 34 are joined together within the engaging hole 31e. The color segment 33 is attached to the indicator portion 30a at its corner. Further, the socket 35b is inserted into the socket hole 31c while the nails 35c are opened by nipping by hand the knobs 35d on both sides of the terminal block 35. By releasing the fingers, the nails 35c return to their original positions to be hooked on the respective nail holes 31d. Thus, the terminal block 35 is fixed to the loading portion 30b.

If the knobs 35d of the nail plates 35a on both sides are again nipped, the nails 35c are opened to enable the terminal block 35 to be removed from the unit main body 30 easily. Since, as described above, the terminal block 35 can be attached to and removed from the unit main body 30 by a simple operation, the unit circuit board Pu can be separated from the unit main body 30 after the terminal block 35 to which the lead wires have been connected is pulled out from the unit main body 30. Therefore, maintenance and inspection of the unit circuit board Pu is very convenient, and the number of necessary operational steps is reduced. After the terminal block 35 is fixed, the protrusion 36c is inserted into the hooking hole 31g of the unit main body 30 and the other end of the cover 36 is pushed down. As a result, the nail 36b is exposed from the exposing hole 31h to lock the cover 36. Thus, the cover 36 is placed over the terminal block 35 and the assembling of the output unit 3 is completed.

After the unit circuit board Pu, on which the indicator 32 and other electronic components have been mounted, is attached to the output unit 3 as assembled above, the plungers 34 on both sides are pulled up to the upper limits of their strokes s (see FIGS. 8, 12(a) and 12(b)). After the attaching face of the output unit 3 is located above the rightmost mounting position of the opening 2a of the main body 2, the unit circuit board Pu is inserted into the insertion grooves 2h of the top wall 2c and the bottom wall 2d. Guided by the insertion grooves 2h, the unit circuit board Pu is inserted straight. As a result, the plug Cp is fitted into the connector jack Cj and the attaching face of the unit main body 30 is brought into contact with the opening face of the main body 2.

At the same time, the engaging nails 2f of the main body 2 are inserted into the engaging holes 31e of the output unit 3 with the latch 34a interposed between the nails of the engaging nail 2f. Then, the plunger 34 is pushed in, so that its tip portion is thrust into the latch 34a to expand the clip portions 34b within the engaging nail 2f. As a result, the plunger 34 is joined to the engaging nail 2f through the latch 34a, and the output unit 3 is fixed to the main body 2. FIG. 12(a) shows how the output unit 3 is fixed to the main body 2. If the top and bottom plungers 34 are pulled out, the latches 34a are freed and, as shown in FIG. 12(b), the plungers 34 are released from the engaging nails 2f, to enable the output unit 3 to be removed from the main body 2.

As described above, according to this embodiment, the "press-and-clamp type" engaging mechanism 2A in which the plunger 34 is held from both sides by the flexible latch 34a that expands within the gate-shaped engaging nail 2f. Therefore, compared with the engaging mechanism of the power supply unit 7 in which the nail 78 is engaged with the engaging window 2g by application of pressing force (described later), the engaging mechanism 2A has advantages that the engagement is more flexible and firmer, and that the nails are hardly broken. The device units (e.g., input units 4 and 5) having the same structure as the output unit 3 are assembled and detachably mounted on the main body 2 in the same manner as in the case of the output unit 3.

To mount the power supply unit 7 using the engaging windows 2g whose structure is different from the above one, the attaching face of the power supply unit 7 is placed at the leftmost position of the main body 2 and the power supply unit 7 is pushed down. Thus, the nails 78 of the power supply unit 7 are fitted into the respective engaging windows 2g, so that the power supply unit 7 is attached to the main body 2 in a semifixed manner. The PC in which all the units 3–7 have been incorporated as described above is attached to a panel by means of the fixing legs 2e protruded on the back side. In a working site having a conveyer system where a DIN rail is prepared for the fixing of the PCs, a large number of PCs can be fixed to the DIN rail so as to be aligned by sliding the movable plates 2s provided on the back of each PC.

To set a program, the setting unit 8 and the lead wires 85 are used. The setting unit 8 and the processing unit 6 are connected through the lead wires 85 by inserting the connectors at the two ends of the lead wires 85 to the connecting holes 67 and 84, respectively. Placing the setting unit 8, which is connected to the processing unit 6, on his palm and holding it, an operator inputs a program by manipulating the touch keys 83a of the operation section 83 while looking at information such as an address indicated in the display window 82b. Using the palm-top setting unit 8, the operator can easily perform, at hand, programming operations such as writing of instructions to a program memory etc.

Figure 14:
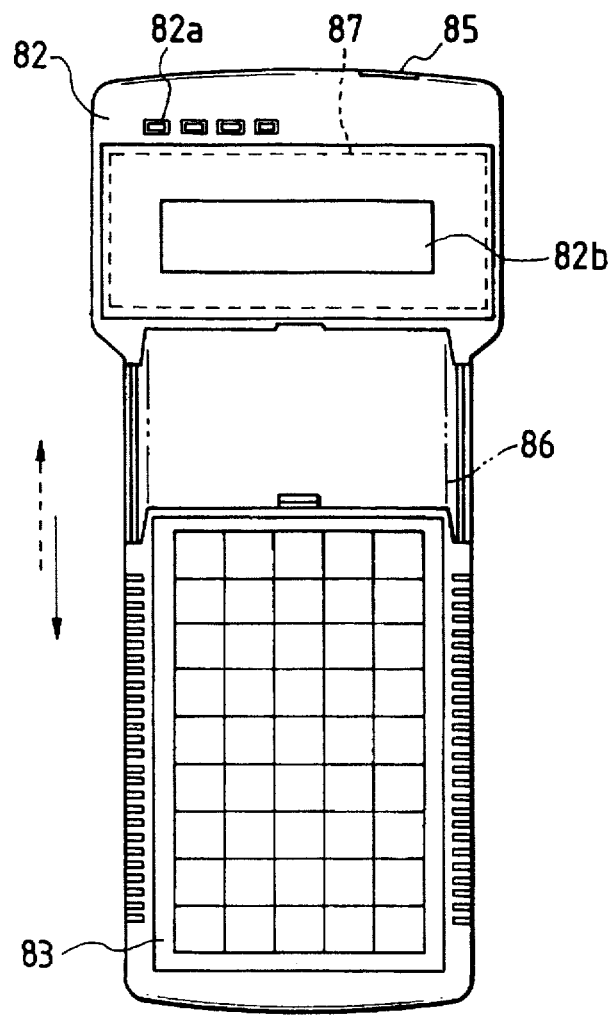
FIG. 14 is a top view of a setting unit.
Figure 15:
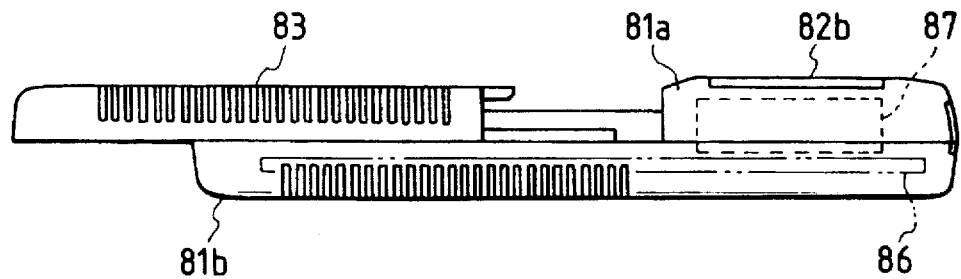
FIG. 15 is a side view of the setting unit.

To replace a system ROM, a user RAM or an internal battery incorporated in the setting unit 8, or inspect the electronic circuit, the operator presses his finger against the operation section 83 and draws it to his side, so that the operation section 83 slides within a plane away from the boundary line 81c, leaving the inside of the setting unit 8 exposed. FIGS. 14 and 15 show the exposed state of the setting unit 8. In this exposed state, the built-in system ROM or user RAM or a discharged battery can be replaced.

Figure 16:
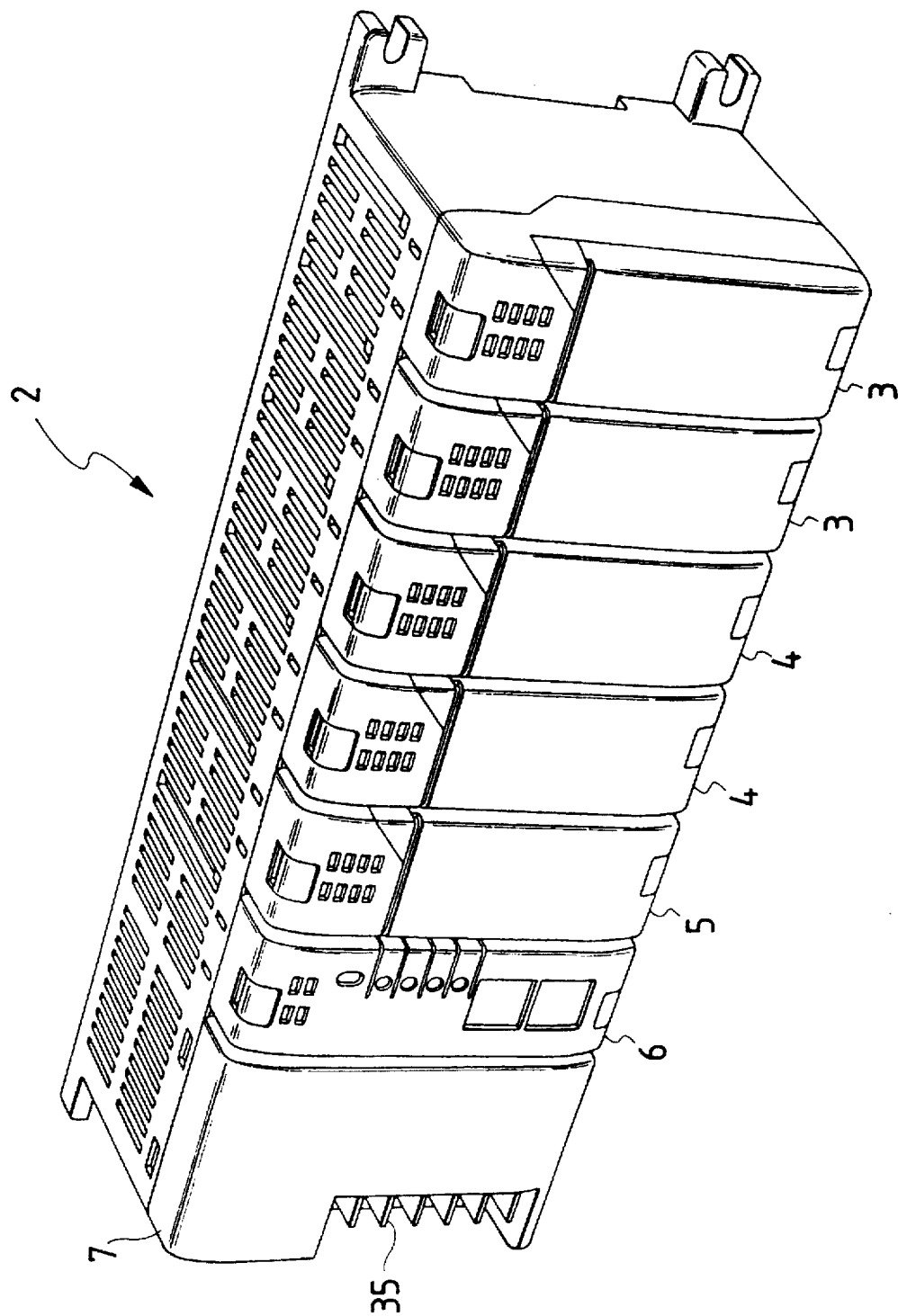
FIG. 16 is a perspective view of a modification of the embodiment.
Figure 17:
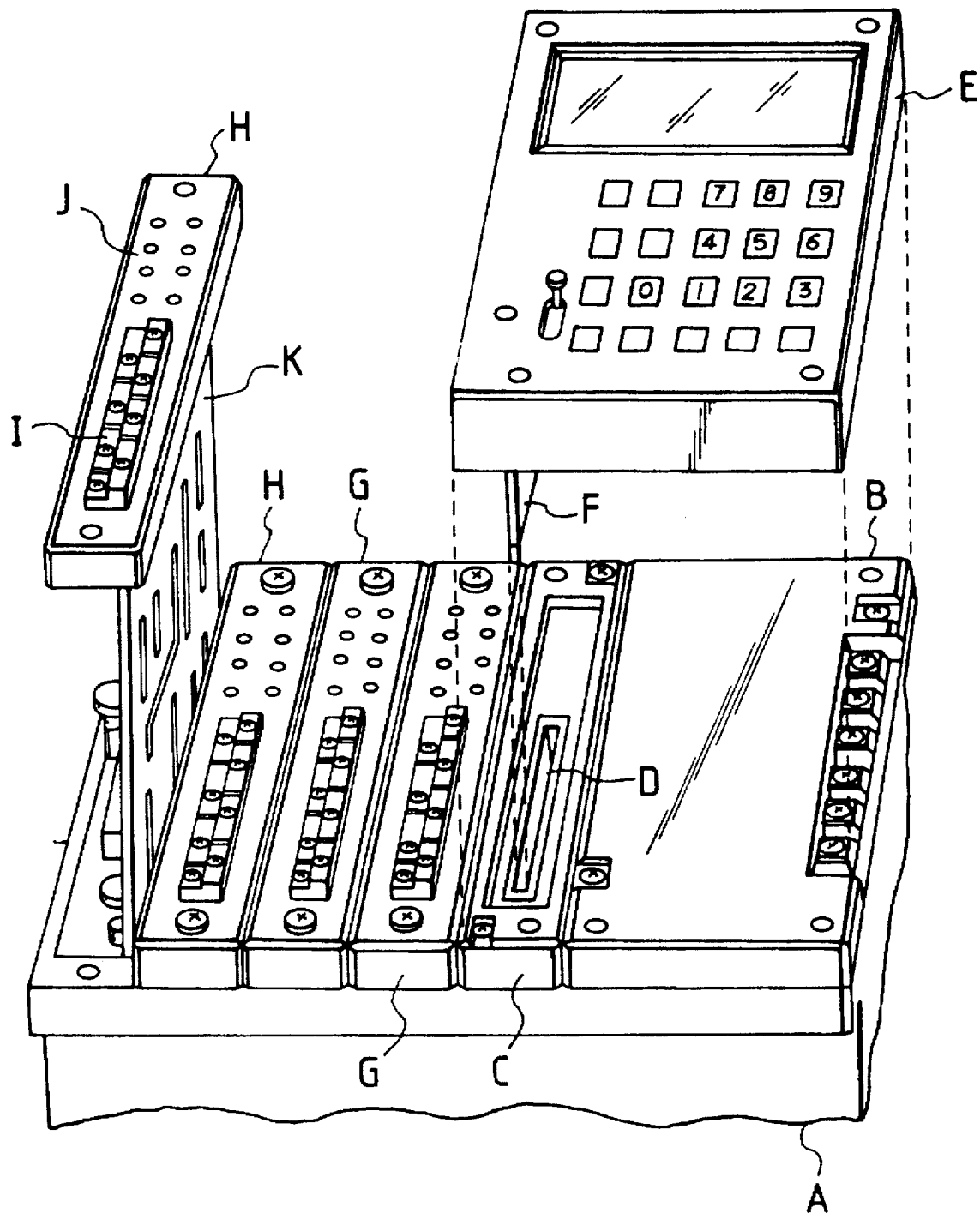
FIG. 17 is a perspective view of a conventional PC.

FIG. 16 is a perspective view showing a modification of the above embodiment, in which the main body 2 is elongated horizontally to increase, by two, the number of device units to be mounted. By adding the output unit 3 or the input units 4 and 5, the PC can be applied to an extended sequence control apparatus.

Although in the above embodiment the power supply unit 7 is attached to the main body 2 in a semifixed manner by engaging the nails 78 of the power supply unit 7 with the engaging windows 2g, the power supply unit 7 may also be mounted detachably using the "press-and-clamp type" engaging mechanism similar to that in the output unit 3 etc. Further, although in the above embodiment the device unit is mounted on the main body 2 after the unit circuit board is attached to it, the terminal block 35 may be attached to the device unit after the unit circuit board is attached to the main body 2. The latter assembling procedure has an advantage that the terminal block 35 can be attached to the device unit and connected to the unit circuit board at one time.

Although in the above embodiment the "press-and-clamp type" engaging mechanism is provided in the mounting portions on both sides of the device unit, the press-and-clamp type and hinge type mechanisms may be employed in a combined manner. Similarly, although in the above embodiment the nail plate 35a having the nail 35a and the knob 35d is provided on both sides of the terminal block 35 for engagement/disengagement thereof, the engagement/disengagement mechanism may be provided only on one side of the terminal block 35. That is, it suffices that an engaging hook portion be provided for engagement/disengagement with the engaging hole 31d formed in the loading portion 30b of the unit main body. Further, although in the above embodiment the triangular color segment 33 is used for the color indication of each type of device unit, a number or symbol may be provided in a rectangular plain color segment for an extension device unit of the same type. That is, it suffices that a small color segment be provided at a part of the indicator portion for the type identification by color. Further, although in the above embodiment the setting unit 8 is connected to the processing unit 6 through the lead wires 85, a cordless remote control system may be employed.

As described above, according to the invention, the device units etc. can be detachably mounted on the main body using substantially no fixing screws. Therefore, the assembling operation or the disassembling operation at the time of maintenance or inspection can be performed easily with a smaller number of operation steps, and the number of parts can be reduced. Since no screws are used, there is no possibility of the problem of thread destruction and the molding cost is reduced. Since the terminal blocks etc. of the device units such as the input and output units are not exposed, there are no possibilities of accidental contact and a contact failure due to the adherence of dirt, dust, etc.

In particular, since the terminal block of each device unit can be attached to or detached from the unit main body by a simple operation on the engaging hook portion, the unit circuit board can be separated from the unit main body after the terminal block having the lead wires connected thereto is pulled out from the unit main body. If the procedure of mounting the terminal block on the unit main body after the unit circuit board is attached to the main body is employed, the terminal block can be attached to the unit main body and connected to the unit circuit board by a one-touch operation. Therefore, the unit circuit board on which the electronic components have been mounted can be maintained or inspected very conveniently with a smaller number of operation steps.

Since the device units have unified, similar external forms, they are suitable for mass-production and an attractive appearance, which would induce customers to purchase the control electronic apparatus. Since the type of device unit can be clearly identified by means of the compact color segment attached to the indicator portion, the device unit can be prevented from being erroneously attached to the main body even if the device units have the unified, similar external forms. Further, the program setting can be performed positively and conveniently by use of the hand-held setting unit, with an additional advantage that erroneous operation caused by misreading of information on the display can be avoided.

The present invention provides an electronic control apparatus having various advantages including easy handling and reduced production costs.

What is claimed is:

1. An electronic control apparatus comprising:

a generally box-shaped main body open to a front side thereof and defining a front circumferential portion;

a mother board detachably secured within the main body;

a plurality of device units connected to the mother board; and a press-and-clamp engaging mechanism for detachably engaging each of the plurality of device units with the front circumferential portion, wherein the press-and-clamp engaging mechanism comprises a gate-shaped nail portion provided on the front circumferential portion, a plunger and a latch having a pair of resilient clip portions, the plunger and the latch being provided in an engaging hole of each of the device units, wherein the clip portions are opened by the plunger so as to be engaged with the gate-shaped nail portion when the plunger is pushed toward the gate-shaped nail portion.

2. An electronic control apparatus comprising:

a generally box-shaped main body open to a front side thereof and defining a front circumferential portion;

a mother board provided in the main body;

a plurality of device units connected to the mother board;

a plurality of unit circuit boards;

a mechanism for detachably mounting each of the unit circuit boards to a corresponding one of the device units;

a plurality of terminal blocks;

a mechanism for detachably connecting each of the unit circuit boards to a corresponding one of the terminal blocks; and a hooking portion provided on at least one side face of the terminal block, for releasable engagement with an engaging hole formed in the device unit, wherein the unit circuit board is brought into engagement with the terminal block when the hooking portion is engaged with the engaging hole.

3. The electronic control apparatus of claim 2, further comprising a nail plate provided on the at least one side face of the terminal block and comprising the hooking portion, a knob portion and a supporting portion located therebetween, wherein the hooking portion is released from the engaging hole when the knob portion is pushed down.

4. An electronic control apparatus comprising:

a generally box-shaped main body open to a front side thereof and defining a front circumferential portion;

a mother board provided in the main body;

a plurality of device units connected to the mother board; and a plurality of color segments replaceably attached to the respective device units, each of said plurality of color segments having a color corresponding to a type of the device unit to which the color segment is replaceably attached.

5. The electronic control apparatus of claim 4, wherein the color segment has a triangular shape and is attached at a corner of an indicator portion of the device unit.

6. An electronic control apparatus comprising:
a generally box-shaped main body open to a front side thereof and defining a front circumferential portion;
a mother board provided in the main body;
a plurality of device units connected to the mother board; and
a palm-top type setting unit electrically connected to at least one of the plurality of device units and having a display section and a slidable operation section, for setting a control apparatus, wherein an inside circuit of the setting unit is exposed when the operation section is slid to an open position.

* * * * *

UNITED STATES PATENT AND TRADEMARK OFFICE
CERTIFICATE OF CORRECTION

PATENT NO. : 5,455,744
DATED : October 3, 1995
INVENTOR(S) : Yuichi WATANABE

It is certified that error appears in the above-indentified patent and that said Letters Patent is hereby corrected as shown below:

Title page,
    item [73], delete "Kay Electronics Industries Co., Ltd." and insert --Koyo Electronics Industries Co., Ltd--.

Signed and Sealed this

Fifth Day of November, 1996

Attest:

BRUCE LEHMAN

Attesting Officer     Commissioner of Patents and Trademarks